(12) United States Patent
Sheng et al.

(10) Patent No.: US 8,895,842 B2
(45) Date of Patent: Nov. 25, 2014

(54) HIGH QUALITY TCO-SILICON INTERFACE CONTACT STRUCTURE FOR HIGH EFFICIENCY THIN FILM SILICON SOLAR CELLS

(75) Inventors: Shuran Sheng, Santa Clara, CA (US);
Yong Kee Chae, Pleasanton, CA (US);
Stefan Klein, Aschaffenburg (DE);
Amir Al-Bayati, San Jose, CA (US);
Bhaskar Kumar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 557 days.

(21) Appl. No.: 12/481,175

(22) Filed: Jun. 9, 2009

(65) Prior Publication Data

US 2010/0051098 A1   Mar. 4, 2010

Related U.S. Application Data

(60) Provisional application No. 61/167,113, filed on Apr. 6, 2009, provisional application No. 61/093,294, filed on Aug. 29, 2008.

(51) Int. Cl.
| | | |
|---|---|---|
| H01L 31/00 | (2006.01) | |
| H01L 21/00 | (2006.01) | |
| H01L 31/20 | (2006.01) | |
| H01L 31/076 | (2012.01) | |
| H01L 31/0224 | (2006.01) | |
| C23C 16/24 | (2006.01) | |
| H01L 31/18 | (2006.01) | |

(52) U.S. Cl.
CPC ............ *H01L 31/076* (2013.01); *H01L 31/202* (2013.01); *H01L 31/022466* (2013.01); *C23C 16/24* (2013.01); *Y02E 10/548* (2013.01); *Y02E 10/545* (2013.01); *H01L 31/1824* (2013.01)

USPC ............................................. 136/256; 438/96

(58) Field of Classification Search
CPC ............... H01L 31/022466; H01L 31/022483; H01L 31/076; H01L 31/1824; H01L 31/204; Y02E 10/545; Y02E 10/548; C23C 16/24
USPC ..................... 136/260, 261, 265, 256; 438/96
See application file for complete search history.

(56) References Cited

U.S. PATENT DOCUMENTS

| 4,063,735 A | 12/1977 | Wendel |
|---|---|---|
| 4,068,043 A | 1/1978 | Carr |

(Continued)

FOREIGN PATENT DOCUMENTS

| EP | 0994515 A2 | 4/2000 |
|---|---|---|
| EP | 1650811 A1 | 4/2006 |

(Continued)

OTHER PUBLICATIONS

Seung Yeop Myong and Koeng Su Lim, "Natural hydrogen treatment effect during formation of double amorphous silicon-carbide p layer structures producing high-efficiency pin-type amorphous silicon solar cells", Applied Physics Letters vol. 86, 033506, 2005, pp. 1-3.*

(Continued)

*Primary Examiner* — Tamir Ayad
(74) *Attorney, Agent, or Firm* — Patterson & Sheridan, LLP (57) ABSTRACT

A method and apparatus for forming solar cells is provided. In one embodiment, a photovoltaic device includes a first TCO layer disposed on a substrate, a second TCO layer disposed on the first TCO layer, and a p-type silicon containing layer formed on the second TCO layer. In another embodiment, a method of forming a photovoltaic device includes forming a first TCO layer on a substrate, forming a second TCO layer on the first TCO layer, and forming a first p-i-n junction on the second TCO layer.

15 Claims, 7 Drawing Sheets

(56) References Cited

U.S. PATENT DOCUMENTS

| | | | |
|---|---|---|---|
| 4,109,271 A * | 8/1978 | Pankove | 257/53 |
| 4,400,577 A | 8/1983 | Spear | |
| 4,471,155 A | 9/1984 | Mohr et al. | |
| 4,476,346 A | 10/1984 | Tawada et al. | |
| 4,490,573 A | 12/1984 | Gibbons | |
| 4,571,448 A * | 2/1986 | Barnett | 136/259 |
| 4,718,947 A * | 1/1988 | Arya | 136/258 |
| 4,728,370 A | 3/1988 | Ishii et al. | |
| 4,776,894 A | 10/1988 | Watanabe et al. | |
| 4,841,908 A | 6/1989 | Jacobson et al. | |
| 4,875,944 A * | 10/1989 | Yoshida | 136/249 |
| 5,021,100 A | 6/1991 | Ishihara et al. | |
| 5,032,884 A | 7/1991 | Yamagishi et al. | |
| 5,206,180 A * | 4/1993 | Yoshida | 438/93 |
| 5,252,142 A | 10/1993 | Matsuyama et al. | |
| 5,256,887 A | 10/1993 | Yang | |
| 5,677,236 A | 10/1997 | Saitoh et al. | |
| 5,700,467 A | 12/1997 | Shima et al. | |
| 5,730,808 A | 3/1998 | Yang et al. | |
| 5,738,732 A | 4/1998 | Nakamura et al. | |
| 5,797,998 A | 8/1998 | Wenham et al. | |
| 5,913,986 A | 6/1999 | Matsuyama | |
| 5,942,050 A | 8/1999 | Green et al. | |
| 6,100,486 A | 8/2000 | Beffa | |
| 6,121,541 A | 9/2000 | Arya | |
| 6,180,870 B1 | 1/2001 | Sano et al. | |
| 6,190,932 B1 | 2/2001 | Yoshimi et al. | |
| 6,200,825 B1 | 3/2001 | Yoshimi et al. | |
| 6,222,115 B1 | 4/2001 | Nakanishi | |
| 6,242,686 B1 | 6/2001 | Kishimoto et al. | |
| 6,265,288 B1 | 7/2001 | Okamoto et al. | |
| 6,288,325 B1 | 9/2001 | Jansen et al. | |
| 6,297,443 B1 | 10/2001 | Nakajima et al. | |
| 6,307,146 B1 | 10/2001 | Takeuchi et al. | |
| 6,309,906 B1 | 10/2001 | Meier et al. | |
| 6,326,304 B1 | 12/2001 | Yoshimi et al. | |
| 6,337,224 B1 | 1/2002 | Okamoto et al. | |
| 6,380,480 B1 | 4/2002 | Norimatsu et al. | |
| 6,395,973 B2 | 5/2002 | Fujisawa et al. | |
| 6,444,277 B1 | 9/2002 | Law et al. | |
| 6,459,034 B2 | 10/2002 | Muramoto et al. | |
| 6,566,159 B2 | 5/2003 | Sawada et al. | |
| 6,602,606 B1 | 8/2003 | Fujisawa et al. | |
| 6,632,993 B2 | 10/2003 | Hayashi et al. | |
| 6,645,573 B2 | 11/2003 | Higashikawa et al. | |
| 6,750,394 B2 | 6/2004 | Yamamoto et al. | |
| 6,777,610 B2 | 8/2004 | Yamada et al. | |
| 6,825,104 B2 | 11/2004 | Horzel et al. | |
| 6,825,408 B2 | 11/2004 | Nagano et al. | |
| 6,960,718 B2 * | 11/2005 | Sano et al. | 136/255 |
| 6,989,553 B2 | 1/2006 | Yokogawa et al. | |
| 7,064,263 B2 | 6/2006 | Sano et al. | |
| 7,071,018 B2 | 7/2006 | Mason et al. | |
| 7,074,641 B2 | 7/2006 | Kondo et al. | |
| 7,235,810 B1 | 6/2007 | Yamazaki et al. | |
| 7,238,545 B2 | 7/2007 | Yoshimi et al. | |
| 7,256,140 B2 | 8/2007 | Call et al. | |
| 7,301,215 B2 | 11/2007 | Kariya | |
| 7,309,832 B2 | 12/2007 | Friedman et al. | |
| 7,332,226 B2 | 2/2008 | Fujisawa et al. | |
| 7,351,993 B2 | 4/2008 | Atanackovic | |
| 7,375,378 B2 | 5/2008 | Manivannan et al. | |
| 7,402,747 B2 | 7/2008 | Sugawara et al. | |
| 2001/0035206 A1 | 11/2001 | Inamasu et al. | |
| 2001/0051388 A1 | 12/2001 | Shiozaki et al. | |
| 2002/0033191 A1 | 3/2002 | Kondo et al. | |
| 2003/0013280 A1 | 1/2003 | Yamanaka | |
| 2003/0041894 A1 | 3/2003 | Sverdrup et al. | |
| 2003/0044539 A1 | 3/2003 | Oswald | |
| 2003/0104664 A1 | 6/2003 | Kondo et al. | |
| 2004/0082097 A1 | 4/2004 | Lohmeyer et al. | |
| 2004/0187914 A1 | 9/2004 | Matsuda et al. | |
| 2004/0231590 A1 | 11/2004 | Ovshinsky | |
| 2005/0115504 A1 | 6/2005 | Ueda et al. | |
| 2005/0173704 A1 | 8/2005 | Saito et al. | |
| 2005/0251990 A1 | 11/2005 | Choi et al. | |
| 2005/0284517 A1 | 12/2005 | Shinohara | |
| 2006/0038182 A1 | 2/2006 | Rogers et al. | |
| 2006/0060138 A1 | 3/2006 | Keller et al. | |
| 2006/0249196 A1 | 11/2006 | Shima | |
| 2006/0283496 A1 | 12/2006 | Okamoto et al. | |
| 2007/0039942 A1 | 2/2007 | Leung et al. | |
| 2007/0137698 A1 | 6/2007 | Wanlass et al. | |
| 2007/0227579 A1 | 10/2007 | Buller et al. | |
| 2007/0249898 A1 | 10/2007 | Otawara | |
| 2007/0298590 A1 | 12/2007 | Choi et al. | |
| 2008/0023068 A1 | 1/2008 | Nakashima et al. | |
| 2008/0047599 A1 | 2/2008 | Buller et al. | |
| 2008/0047603 A1 | 2/2008 | Krasnov | |
| 2008/0057220 A1 | 3/2008 | Bachrach et al. | |
| 2008/0110491 A1 | 5/2008 | Buller et al. | |
| 2008/0115821 A1 | 5/2008 | Xu et al. | |
| 2008/0153280 A1 | 6/2008 | Li et al. | |
| 2008/0156370 A1 | 7/2008 | Abdallah et al. | |
| 2008/0160661 A1 | 7/2008 | Henley | |
| 2008/0173350 A1 | 7/2008 | Choi et al. | |
| 2008/0188033 A1 | 8/2008 | Choi et al. | |
| 2008/0196761 A1 | 8/2008 | Nakano et al. | |
| 2009/0020154 A1 | 1/2009 | Sheng et al. | |

FOREIGN PATENT DOCUMENTS

| | | |
|---|---|---|
| JP | 4063735 A | 2/1992 |
| JP | 4068043 A | 3/1992 |
| JP | 2003-253435 A | 9/2003 |
| JP | 2004/071716 A | 3/2004 |
| JP | 2004/296652 A | 10/2004 |
| JP | 2005/135986 A | 5/2005 |
| JP | 2006/310694 A | 11/2006 |
| JP | 2006/319068 A | 11/2006 |
| JP | 2007/035914 A | 2/2007 |
| JP | 2007/305826 A | 11/2007 |
| JP | 2008/181965 A | 8/2008 |
| WO | WO-03/065462 A1 | 8/2003 |
| WO | WO-2007/118252 A2 | 10/2007 |
| WO | WO-2007149945 A2 | 12/2007 |

OTHER PUBLICATIONS

Poortmans, Jef and Arkhipov, Vladimir, "Thin Film Solar Cells, Fabrication, Characterization, and Applications", 2006, John Wiley & Sons Ltd., pp.*

PCT international search report and written opinion of PCT/US2010/027002, dated Oct. 14, 2010.

Official Letter dated May 13, 2013, from China Patent Office for corresponding Chinese Patent Application No. 201080012538.4.

* cited by examiner

HIGH QUALITY TCO-SILICON INTERFACE CONTACT STRUCTURE FOR HIGH EFFICIENCY THIN FILM SILICON SOLAR CELLS

CROSS-REFERENCE TO RELATED APPLICATIONS

This application claims benefit of U.S. Provisional Application Ser. No. 61/167,113 filed Apr. 6, 2009 and U.S. Provisional Application Ser. No. 61/093,294 filed Aug. 30, 2008, which is are incorporated by references in their entireties reference in its entirety.

BACKGROUND OF THE INVENTION

1. Field of the Invention

Embodiments of the present invention generally relate to solar cells and methods for forming the same. More particularly, embodiments of the present invention relate to an interface layer formed in thin-film and crystalline solar cells.

2. Description of the Related Art

Crystalline silicon solar cells and thin film solar cells are two types of solar cells. Crystalline silicon solar cells typically use either mono-crystalline substrates (i.e., single-crystal substrates of pure silicon) or multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-n junctions. Suitable substrates include glass, metal, and polymer substrates.

To expand the economic use of solar cells, efficiency must be improved. Solar cell efficiency relates to the proportion of incident radiation converted into useful electricity. To be useful for more applications, solar cell efficiency must be improved beyond the current best performance of approximately 15%. With energy costs rising, there is a need for improved thin film solar cells and methods and apparatuses for forming the same in a factory environment.

SUMMARY OF THE INVENTION

Embodiments of the invention provide methods of forming solar cells. Some embodiments provide a method of forming an interface layer between a transparent conductive oxide (TCO) layer and a solar cell junction. In one embodiment, a photovoltaic device includes a first TCO layer disposed on a substrate, a second TCO layer disposed on the first TCO layer, and a p-type silicon containing layer formed on the second TCO layer.

In another embodiment, a photovoltaic device includes a TCO layer disposed on a substrate, an interface layer disposed on the TCO layer, wherein the interface layer is a p-type silicon containing layer comprising carbon, and a p-type silicon containing layer disposed on the interface layer.

In yet another embodiment, a method of forming a photovoltaic device includes forming a first TCO layer on a substrate, forming a second TCO layer on the first TCO layer, and forming a first p-i-n junction on the second TCO layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Thin-film solar cells are generally formed from numerous types of films, or layers, put together in many different ways. Most films used in such devices incorporate a semiconductor element that may comprise silicon, germanium, carbon, boron, phosphorous, nitrogen, oxygen, hydrogen and the like. Characteristics of the different films include degrees of crystallinity, dopant type, dopant concentration, film refractive index, film extinction coefficient, film transparency, film absorption, and conductivity. Most of these films can be formed by use of a chemical vapor deposition process, which may include some degree of ionization or plasma formation.

Charge generation during a photovoltaic process is generally provided by a bulk semiconductor layer, such as a silicon containing layer. The bulk layer is also sometimes called an intrinsic layer to distinguish it from the various doped layers present in the solar cell. The intrinsic layer may have any desired degree of crystallinity, which will influence its light-absorbing characteristics. For example, an amorphous intrinsic layer, such as amorphous silicon, will generally absorb light at different wavelengths from intrinsic layers having different degrees of crystallinity, such as microcrystalline or nanocrystalline silicon. For this reason, it is advantageous to use both types of layers to yield the broadest possible absorption characteristics.

Silicon and other semiconductors can be formed into solids having varying degrees of crystallinity. Solids having essentially no crystallinity are amorphous, and silicon with negligible crystallinity is referred to as amorphous silicon. Completely crystalline silicon is referred to as crystalline, polycrystalline, or monocrystalline silicon. Polycrystalline silicon is crystalline silicon including numerous crystal grains separated by grain boundaries. Monocrystalline silicon is a single crystal of silicon. Solids having partial crystallinity, that is a crystal fraction between about 5% and about 95%, are referred to as nanocrystalline or microcrystalline, generally referring to the size of crystal grains suspended in an amorphous phase. Solids having larger crystal grains are referred to as microcrystalline, whereas those with smaller crystal grains are nanocrystalline. It should be noted that the term "crystalline silicon" may refer to any form of silicon having a crystal phase, including microcrystalline and nanocrystalline silicon.

Figure 1:
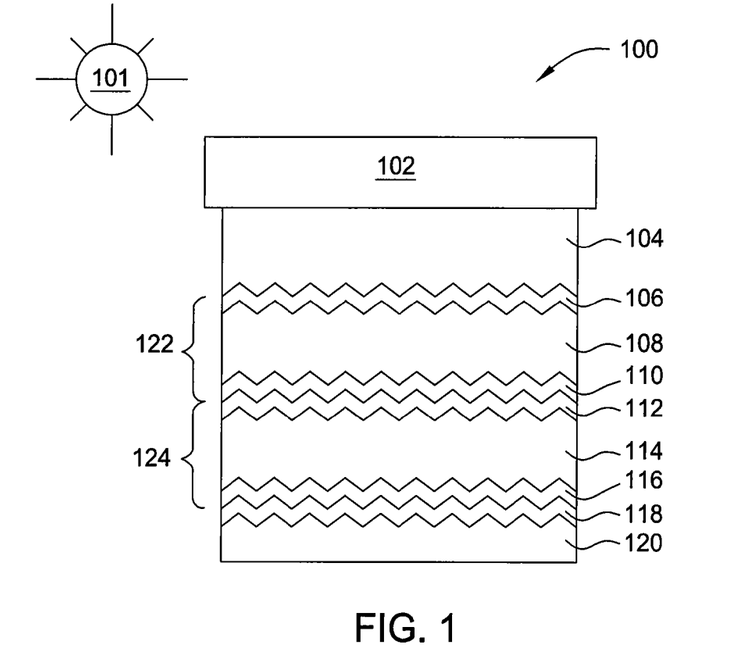
FIG. 1 depicts a schematic side-view of a tandem junction thin-film solar cell according to one embodiment of the invention.

FIG. 1 is a schematic diagram of an embodiment of a multi-junction solar cell 100 oriented toward a light or solar radiation 101. The solar cell 100 includes a substrate 102. A first transparent conducting oxide (TCO) layer 104 formed over the substrate 102, a first p-i-n junction 122 formed over the first TCO layer 104. A second p-i-n junction 124 formed over the first p-i-n junction 122, a second TCO layer 118 formed over the second p-i-n junction 124, and a metal back layer 120 formed over the second TCO layer 118. The substrate 102 may be a glass substrate, polymer substrate, metal substrate, or other suitable substrate, with thin films formed thereover.

The first TCO layer 104 and the second TCO layer 118 may each comprise tin oxide, zinc oxide, indium tin oxide, cadmium stannate, combinations thereof, or other suitable materials. It is understood that the TCO materials may also additionally include dopants and components. For example, zinc oxide may further include dopants, such as tin, aluminum, gallium, boron, and other suitable dopants. Zinc oxide, in one embodiment, comprises 5 atomic % or less of dopants, and more preferably comprises 2.5 atomic % or less aluminum. In certain instances, the substrate 102 may be provided by the glass manufacturers with the first TCO layer 104 already deposited thereon.

To improve light absorption by enhancing light trapping, the substrate 102 and/or one or more of thin films formed thereover may be optionally textured by wet, plasma, ion, and/or other mechanical processes. For example, in the embodiment shown in FIG. 1, the first TCO layer 104 is sufficiently textured so that the topography of the surface is substantially transferred to the subsequent thin films deposited thereover.

The first p-i-n junction 122 may comprise a p-type silicon containing layer 106, an intrinsic type silicon containing layer 108 formed over the p-type silicon containing layer 106, and an n-type silicon containing layer 110 formed over the intrinsic type silicon containing layer 108. In certain embodiments, the p-type silicon containing layer is a p-type amorphous silicon layer 106 having a thickness between about 60 Å and about 300 Å. In certain embodiments, the intrinsic type silicon containing layer 108 is an intrinsic type amorphous silicon layer having a thickness between about 1,500 Å and about 3,500 Å. In certain embodiments, the n-type silicon containing layer is a n-type microcrystalline silicon layer may be formed to a thickness between about 100 Å and about 400 Å.

The second p-i-n junction 124 may comprise a p-type silicon containing layer 112 and an intrinsic type silicon containing layer 114 formed over the p-type silicon containing layer 112, and a n-type silicon containing layer 116 formed over the intrinsic type silicon containing layer 114. In certain embodiments, the p-type silicon containing layer 112 may be a p-type microcrystalline silicon layer 112 having a thickness between about 100 Å and about 400 Å. In certain embodiments, the intrinsic type silicon containing layer 114 is an intrinsic type microcrystalline silicon layer having a thickness between about 10,000 Å and about 30,000 Å. In certain embodiments, the n-type silicon containing layer 116 is an amorphous silicon layer having a thickness between about 100 Å and about 500 Å.

The metal back layer 120 may include, but not limited to a material selected from the group consisting of Al, Ag, Ti, Cr, Au, Cu, Pt, alloys thereof, and combinations thereof. Other processes may be performed to form the solar cell 100, such a laser scribing processes. Other films, materials, substrates, and/or packaging may be provided over metal back layer 120 to complete the solar cell device. The formed solar cells may be interconnected to form modules, which in turn can be connected to form arrays.

Solar radiation 101 is primarily absorbed by the intrinsic layers 108, 114 of the p-i-n junctions 122, 124 and is converted to electron-holes pairs. The electric field created between the p-type layer 106, 112 and the n-type layer 110, 116 that stretches across the intrinsic layer 108, 114 causes electrons to flow toward the n-type layers 110, 116 and holes to flow toward the p-type layers 106, 112 creating a current. The first p-i-n junction 122 may comprise an intrinsic type amorphous silicon layer 108 and the second p-i-n junction 124 may comprise an intrinsic type microcrystalline silicon layer 114 to take advantage of the properties of amorphous silicon and microcrystalline silicon which absorb different wavelengths of the solar radiation 101. Therefore, the formed solar cell 100 is more efficient, as it captures a larger portion of the solar radiation spectrum. The intrinsic layer 108, 114 of amorphous silicon and the intrinsic layer of microcrystalline are stacked in such a way that solar radiation 101 first strikes the intrinsic type amorphous silicon layer 108 and then strikes the intrinsic type microcrystalline silicon layer 114, since amorphous silicon has a larger bandgap than microcrystalline silicon. Solar radiation not absorbed by the first p-i-n junction 122 is transmitted to the second p-i-n junction 124.

In an embodiment wherein the intrinsic silicon containing layer 108 is an intrinsic amorphous silicon layer, the intrinsic amorphous silicon layer 108 may be deposited by providing a gas mixture of hydrogen gas to silane gas in a flow rate ratio by volume of about 20:1 or less. Silane gas may be provided at a flow rate between about 0.5 sccm/L and about 7 sccm/L. Hydrogen gas may be provided at a flow rate between about 5 sccm/L and 60 sccm/L. An RF power between 15 mW/cm$^2$ and about 250 mW/cm$^2$ may be provided to the showerhead. The pressure of the chamber may be maintained between about 0.1 Torr and 20 Torr, such as between about 0.5 Torr and about 5 Torr. The deposition rate of the intrinsic type amorphous silicon layer 108 will be about 100 Å/min or more. In an exemplary embodiment, the intrinsic type amorphous silicon layer 108 is deposited at a hydrogen to silane flow rate ratio by volume at about 12.5:1.

In an embodiment wherein the intrinsic type silicon containing layer 114 is an intrinsic type microcrystalline silicon layer, the intrinsic type microcrystalline silicon layer 114 may be deposited by providing a gas mixture of silane gas and hydrogen gas in a flow rate ratio by volume of hydrogen to silane between about 20:1 and about 200:1. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. Applying RF power between about 300 mW/cm$^2$ or greater, such as 600 mW/cm$^2$ or greater, at a chamber pressure between about 1 Torr and about 100 Torr, such as between about 3 Torr and about 20 Torr, or between about 4 Torr and about 12 Torr, will generally deposit an intrinsic type microcrystalline silicon layer having crystalline fraction between about 20 percent and about 80 percent, such as between 55 percent and about 75 percent, at a rate of about 200 Å/min or more, such as about 500 Å/min. In some embodiments, it may be advantageous to ramp the power density of the applied RF power from a first power density to a second power density during deposition.

In another embodiment, the intrinsic type microcrystalline silicon layer 114 may be deposited using multiple steps, wherein the portion of the layer deposited during each step has a different hydrogen dilution ratio that can provide different crystal fraction of the deposited films. In one embodiment, for example, the flow rate ratio by volume of hydrogen to silane may be reduced in four steps from 100:1 to 95:1 to 90:1 and then to 85:1. In one embodiment, silane gas may be provided at a flow rate between about 0.1 sccm/L and about 5 sccm/L, such as about 0.97 sccm/L. Hydrogen gas may be provided at a flow rate between about 10 sccm/L and about 200 sccm/L, such as between about 80 sccm/L and about 105 sccm/L. In an exemplary embodiment wherein the deposition process has multiple steps, such as four steps, hydrogen gas flow may start at about 97 sccm/L during the first step, and be gradually reduced to about 92 sccm/L, 88 sccm/L, and 83 sccm/L respectively in the subsequent process steps. Applying RF power between about 300 mW/cm$^2$ or greater, such as about 490 mW/cm$^2$ at a chamber pressure between about 1 Torr and about 100 Torr, for example between about 3 Torr and about 20 Torr, such as between about 4 Torr and about 12 Torr, such as about 9 Torr, will result in deposition of an intrinsic type microcrystalline silicon layer at a rate of about 200 Å/min or more, such as 400 Å/min.

Charge collection is generally provided by doped semiconductor layers, such as silicon layers doped with p-type or n-type dopants. P-type dopants are generally Group III elements, such as boron or aluminum. N-type dopants are generally Group V elements, such as phosphorus, arsenic, or antimony. In most embodiments, boron is used as the p-type dopant and phosphorus as the n-type dopant. These dopants may be added to the p-type and n-type layers 106, 110, 112, 116 described above by including boron-containing or phosphorus-containing compounds in the reaction mixture. Suitable boron and phosphorus compounds generally comprise substituted and unsubstituted lower borane and phosphine oligomers. Some suitable boron compounds include trimethylboron (B(CH$_3$)$_3$ or TMB), diborane (B$_2$H$_6$), boron trifluoride (BF$_3$), and triethylboron (B(C$_2$H$_5$)$_3$ or TEB). Phosphine is the most common phosphorus compound. The dopants are generally provided with a carrier gas, such as hydrogen, helium, argon, or other suitable gas. If hydrogen is used as the carrier gas, the total hydrogen in the reaction mixture is increased. Thus, the hydrogen ratios discussed above will include the portion of hydrogen contributed carrier gas used to deliver the dopants.

Dopants will generally be provided as dilatants in an inert gas or carrier gas. For example, dopants may be provided at molar or volume concentrations of about 0.5% in a carrier gas. If a dopant is provided at a volume concentration of 0.5% in a carrier gas flowing at 1.0 sccm/L, the resultant dopant flow rate will be 0.005 sccm/L. Dopants may be provided to a reaction chamber at flow rates between about 0.0002 sccm/L and about 0.1 sccm/L depending on the degree of doping desired. In general, dopant concentration is maintained between about 10$^{18}$ atoms/cm$^3$ and about 10$^{20}$ atoms/cm$^3$.

In one embodiment wherein the p-type silicon containing layer 112 is a p-type microcrystalline silicon layer, the p-type microcrystalline silicon layer 112 may be deposited by providing a gas mixture of hydrogen gas and silane gas in flow rate ratio by volume of hydrogen-to-silane of about 200:1 or greater, such as 1000:1 or less, for example between about 250:1 and about 800:1, and in a further example about 601:1 or about 401:1. Silane gas may be provided at a flow rate between about 0.1 sccm/L and about 0.8 sccm/L, such as between about 0.2 sccm/L and about 0.38 sccm/L. Hydrogen gas may be provided at a flow rate between about 60 sccm/L and about 500 sccm/L, such as about 143 sccm/L. TMB may be provided at a flow rate between about 0.0002 sccm/L and about 0.0016 sccm/L, such as about 0.00115 sccm/L. If TMB is provided in a 0.5% molar or volume concentration in a carrier gas, then the dopant/carrier gas mixture may be provided at a flow rate between about 0.04 sccm/L and about 0.32 sccm/L, such as about 0.23 sccm/L. Applying RF power between about 50 mW/cm$^2$ and about 700 mW/cm$^2$, such as between about 290 mW/cm$^2$ and about 440 mW/cm$^2$, at a chamber pressure between about 1 Torr and about 100 Torr, such as between about 3 Torr and about 20 Torr, between 4 Torr and about 12 Torr, or about 7 Torr or about 9 Torr, will deposit a p-type microcrystalline layer having crystalline fraction between about 20 percent and about 80 percent, such as between 50 percent and about 70 percent for a microcrystalline layer, at about 10 Å/min or more, such as about 143 Å/min or more.

In one embodiment wherein the p-type silicon containing layer 106 is a p-type amorphous silicon layer, the p-type amorphous silicon layer 106 may be deposited by providing a gas mixture of hydrogen gas to silane gas in a flow rate ratio by volume of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. If trimethylboron is provided in a 0.5% molar or volume concentration in a carrier gas, then the dopant/carrier gas mixture may be provided at a flow rate between about 1 sccm/L and about 10 sccm/L. Applying RF power between about 15 mWatts/cm$^2$ and about 200 mWatts/cm$^2$ at a chamber pressure between about 0.1 Torr and 20 Torr, such as between about 1 Torr and about 4 Torr, will deposit a p-type amorphous silicon layer at about 100 Å/min or more. The addition of methane or other carbon containing compounds, such as CH$_4$, C$_3$H$_8$, C$_4$H$_{10}$, or C$_2$H$_2$, can be used to form a carbon containing p-type amorphous silicon layer 106 that absorbs less light than other silicon containing materials. In other words, in the configuration where the formed p-type amorphous silicon layer 106 contains alloying elements, such as carbon, the formed layer will have improved light transmission properties, or window properties (e.g., to lower absorption of solar radiation). The increase in the amount of solar radiation transmitted through the p-type amorphous silicon layer 106 can be absorbed by the intrinsic layers, thus improving the efficiency of the solar cell. In the embodiment wherein trimethylboron is used to provide boron dopants in the p-type amorphous silicon layer 106, the boron dopant concentration is maintained at between about 1×10$^{18}$ atoms/cm$^3$ and about 1×10$^{20}$ atoms/cm$^3$. In an embodiment wherein methane gas is added and used to form a carbon containing p-type amorphous silicon layer, a carbon concentration in the carbon containing p-type amorphous silicon layer is controlled to between about 10 atomic percent and about 20 atomic percent. In one embodiment, the p-type amorphous silicon layer 106 has a thickness between about 20 Å and about 300 Å, such as between about 80 Å and about 200 Å.

In one embodiment wherein the n-type silicon containing layer 110 is a n-type microcrystalline silicon layer, the n-type microcrystalline silicon layer 110 may be deposited by providing a gas mixture of hydrogen gas to silane gas in a flow rate ratio by volume of about 100:1 or more, such as about 500:1 or less, such as between about 150:1 and about 400:1, for example about 304:1 or about 203:1. Silane gas may be provided at a flow rate between about 0.1 sccm/L and about 0.8 sccm/L, such as between about 0.32 sccm/L and about 0.45 sccm/L, for example about 0.35 sccm/L. Hydrogen gas may be provided at a flow rate between about 30 sccm/L and about 250 sccm/L, such as between about 68 sccm/L and about 143 sccm/L, for example about 71.43 sccm/L. Phosphine may be provided at a flow rate between about 0.0005 sccm/L and about 0.006 sccm/L, such as between about 0.0025 sccm/L and about 0.015 sccm/L, for example about 0.005 sccm/L. In other words, if phosphine is provided in a 0.5% molar or volume concentration in a carrier gas, then the dopant/carrier gas may be provided at a flow rate between about 0.1 sccm/L and about 5 sccm/L, such as between about 0.5 sccm/L and about 3 sccm/L, for example between about 0.9 sccm/L and about 1.088 sccm/L. Applying RF power between about 100 mW/cm$^2$ and about 900 mW/cm$^2$, such as about 370 mW/cm$^2$, at a chamber pressure of between about 1 Torr and about 100 Torr, such as between about 3 Torr and about 20 Torr, more preferably between 4 Torr and about 12 Torr, for example about 6 Torr or about 9 Torr, will deposit an n-type microcrystalline silicon layer having a crystalline fraction between about 20 percent and about 80 percent, such as between 50 percent and about 70 percent, at a rate of about 50 Å/min or more, such as about 150 Å/min or more.

In one embodiment wherein the n-type silicon containing layer 116 is a n-type amorphous silicon layer, the n-type amorphous silicon layer 116 may be deposited by providing a gas mixture of hydrogen gas to silane gas in a flow rate ratio by volume of about 20:1 or less, such as about 5:5:1 or 7.8:1. Silane gas may be provided at a flow rate between about 0.1 sccm/L and about 10 sccm/L, such as between about 1 sccm/L and about 10 sccm/L, between about 0.1 sccm/L and 5 sccm/L, or between about 0.5 sccm/L and about 3 sccm/L, for example about 1.42 sccm/L or 5.5 sccm/L. Hydrogen gas may be provided at a flow rate between about 1 sccm/L and about 40 sccm/L, such as between about 4 sccm/L and about 40 sccm/L, or between about 1 sccm/L and about 10 sccm/L, for example about 6.42 sccm/L or 27 sccm/L. Phosphine may be provided at a flow rate between about 0.0005 sccm/L and about 0.075 sccm/L, such as between about 0.0005 sccm/L and about 0.0015 sccm/L or between about 0.015 sccm/L and about 0.03 sccm/L, for example about 0.0095 sccm/L or 0.023 sccm/L. If phosphine is provided in a 0.5% molar or volume concentration in a carrier gas, then the dopant/carrier gas mixture may be provided at a flow rate between about 0.1 sccm/L and about 15 sccm/L, such as between about 0.1 sccm/L and about 3 sccm/L, between about 2 sccm/L and about 15 sccm/L, or between about 3 sccm/L and about 6 sccm/L, for example about 1.9 sccm/L or about 4.71 sccm/L. Applying RF power between about 25 mW/cm$^2$ and about 250 mW/cm$^2$, such as about 60 mW/cm$^2$ or about 80 mW/cm$^2$, at a chamber pressure between about 0.1 Torr and about 20 Torr, such as between about 0.5 Torr and about 4 Torr, or about 1.5 Torr, will deposit an n-type amorphous silicon layer at a rate of about 100 Å/min or more, such as about 200 Å/min or more, such as about 300 Å or about 600 Å/min.

In some embodiments, alloys of silicon with other elements such as oxygen, carbon, nitrogen, hydrogen, and germanium may be useful. These other elements may be added to silicon films by supplementing the reactant gas mixture with sources of each. Alloys of silicon may be used in any type of silicon layers, including interface layer, p-type, n-type, PIB, wavelength selective reflector (WSR) layer, or intrinsic type silicon layers. For example, carbon may be added to the silicon films by adding a carbon source such as methane ($CH_4$) to the gas mixture. In general, most $C_1$-$C_4$ hydrocarbons may be used as carbon sources. Alternately, organosilicon compounds, such as organosilanes, organosiloxanes, organosilanols, and the like may serve as both silicon and carbon sources. Germanium compounds such as germanes and organogermanes, along with compounds comprising silicon and germanium, such as silylgermanes or germylsilanes, may serve as germanium sources. Oxygen gas ($O_2$) may serve as an oxygen source. Other oxygen sources include, but are not limited to, oxides of nitrogen (nitrous oxide—$N_2O$, nitric oxide—NO, dinitrogen trioxide—$N_2O_3$, nitrogen dioxide—$NO_2$, dinitrogen tetroxide—$N_2O_4$, dinitrogen pentoxide—$N_2O_5$, and nitrogen trioxide—$NO_3$), hydrogen peroxide ($H_2O_2$), carbon monoxide or dioxide (CO or $CO_2$), ozone ($O_3$), oxygen atoms, oxygen radicals, and alcohols (ROH, where R is any organic or hetero-organic radical group). Nitrogen sources may include nitrogen gas ($N_2$), ammonia ($NH_3$), hydrazine ($N_2H_2$), amines ($R_xNR'_{3-x}$, where x is 0 to 3, and each R and R' is independently any organic or hetero-organic radical group), amides ($(RCO)_xNR'_{3-x}$, where x is 0 to 3 and each R and R' is independently any organic or hetero-organic radical group), imides (RCONCOR', where each R and R' is independently any organic or hetero-organic radical group), enamines ($R_1R_2C$=$C_3NR_4R_5$, where each $R_1$-$R_5$ is independently any organic or hetero-organic radical group), and nitrogen atoms and radicals.

Figure 2:
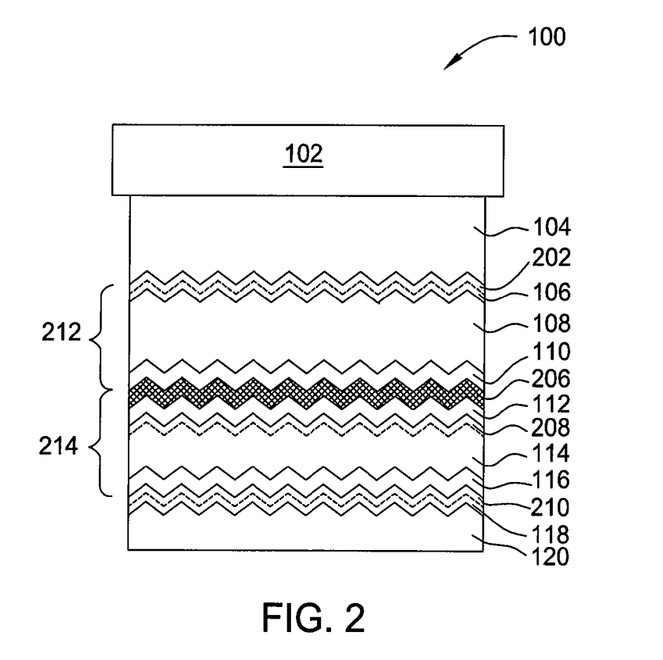
FIG. 2 depicts schematic side-view of a tandem junction thin-film solar cell having an interface layer disposed between a TCO layer and a cell junction according to one embodiment of the invention.

In order to improve conversion efficiency and reduce contact resistance, an interface layer may be formed at the interface of the TCO layer 104 and the p-type silicon containing layer 106. FIG. 2 depicts an interface layer 202 disposed between the TCO layer 104 and the p-type silicon containing layer 106. The interface layer 202 provides a good interface that can improve adhesion between the films formed thereon and the TCO substrate. In some embodiments, the interface layer 202 may be heavily doped or degenerately doped silicon containing layer formed by supplying dopant compounds at high rates, for example at rates in the upper part of the recipes described above. It is thought that degenerately doping improves charge collection by providing low-resistance contact junctions. Degenerate doping is also thought to improve conductivity of some layers, such as amorphous layers.

In one embodiment, the interface layer 202 is a degeneratively-doped p-type amorphous silicon layer (a heavily doped p-type amorphous silicon, p++ layer). The degenerately (e.g., heavily) doped p$^{++}$-type amorphous silicon layer 202 has a Group III element doping concentration higher than the p-type silicon containing layer 106. The degenerately (e.g., heavily) doped p$^{++}$-type amorphous silicon layer 202 has a doping concentration equivalent to a layer formed using TMB and silane at a mixture flow rate ratio by volume between about 2:1 and about 6:1 at a pressure of between about 2 and about 2.5 Torr, where the TMB precursor comprises 0.5% molar or volume concentration of TMB. The degenerately (e.g., heavily) doped p$^{++}$-type amorphous silicon layer 202 is formed at a plasma power between about 45 milliwatts/cm$^2$ (2400 Watts) and about 91 milliwatts/cm$^2$ (4800 Watts). In one example, the degenerately doped p$^{++}$-type amorphous silicon layer 202 may be formed by providing silane at a flow rate of between about 2.1 sccm/L (e.g., 6000 sccm) about 3.1 sccm/L (e.g., 9000 sccm), hydrogen gas at a flow rate so that the hydrogen gas to silane gas mixture ratio is about 6.0, a doping precursor at a TMB gas (e.g., 0.5% molar or volume concentration of TMB) to silane gas mixture flow rate ratio by volume of 6:1, while the substrate support temperature is maintained at about 200° C., the plasma power is controlled between about 57 milliwatts/cm² (3287 Watts) and the chamber pressure is maintained at about 2.5 Torr for about 2-10 seconds to form about a 10-50 Å film, such as a 20 Å film. In one embodiment, the heavily doped amorphous silicon layer 202 has a Group III element dopant concentration formed in the amorphous silicon layer between about $10^{20}$ atoms/cm³ and about $10^{21}$ atoms/cm³.

In one embodiment, the interface layer 202 may be a degeneratively-doped p-type amorphous silicon carbide layer (a heavily doped p-type amorphous silicon carbide, p++ layer). The carbon elements may be provided by supplying a carbon containing gas into the gas mixture while forming the heavily doped p-type amorphous silicon carbide layer 202. In one embodiment, the addition of methane or other carbon containing compounds, such as $CH_4$, $C_3H_8$, $C_4H_{10}$, or $C_2H_2$, can be used to form heavily doped p-type amorphous silicon carbide layer 202 that absorbs less light than other silicon containing materials. It is believed the addition of the carbon atoms into the interface layer 202 may improve transparency of the interface layer 202 so that less light will be absorbed or consumed while transmitting through the film layers, thereby improving the conversion efficiency of the solar cell. In one embodiment, the carbon concentration in the heavily doped p-type amorphous silicon carbide layer 202 is controlled at a concentration between about 1 atomic percent and about 50 atomic percent. In one embodiment, the interface p-type amorphous silicon carbide layer 202 has a thickness between about 20 Å and about 300 Å, such as between about 10 Å and about 200 Å, for example between about 20 Å and about 100 Å.

In the particular embodiment depicted in FIG. 2, as the interface layer 202 is configured to be a heavily doped p-type amorphous silicon layer or a heavily doped p-type amorphous silicon carbide layer, the p-type silicon containing layer 106 may be configured to be a p-type amorphous silicon layer or a p-type amorphous silicon carbide layer (an amorphous silicon alloy layer) to meet different process requirements. In one embodiment, the interface layer 202 is a heavily doped p-type amorphous silicon layer and the p-type silicon containing layer 106 is a p-type amorphous silicon layer or a p-type amorphous silicon carbide layer. In another embodiment, the interface layer 202 is a heavily doped p-type amorphous silicon carbide layer and the p-type silicon containing layer 106 is a p-type amorphous silicon carbide layer.

Furthermore, a wavelength selective reflector (WSR) layer 206 may be disposed between the first p-i-n junction 212 and the second p-i-n junction 214. The WSR layer 206 is configured to have film properties that improve light scattering and current generation in the formed solar cell 100. Additionally, the WSR layer 206 also provides a good p-n tunnel junction that has a high electrical conductivity and a tailored bandgap range that affect its transmissive and reflective properties to improve the formed solar cell's light conversion efficiency. The WSR layer 206 actively serves as an intermediate reflector having a desired refractive index, or ranges of refractive indexes, to reflect light received from the light incident side of the solar cell 100. The WSR layer 206 also serves as a junction layer that boosts the absorption of the short to mid wavelengths of light (e.g., 280 nm to 800 nm) in the first p-i-n junction 212 and improves short-circuit current, resulting in improved quantum and conversion efficiency. The WSR layer 206 further has high film transmittance for mid to long wavelengths of light (e.g., 500 nm to 1100 nm) to facilitate the transmission of light to the layers formed in the second junction 214. Further, it is generally desirable for the WSR layer 206 to absorb as little light as possible while reflecting desirable wavelengths of light (e.g., shorter wavelengths) back to the layers in the first p-i-n junction 212 and transmitting desirable wavelengths of light (e.g., longer wavelengths) to the layers in the second p-i-n junction 214. Additionally, the WSR layer 206 can have a desirable bandgap and high film conductivity so as to efficiently conduct the generated current and allow electrons to flow from the first p-i-n junction 212 to the second p-i-n junction 214, and avoid blocking the generated current. In one embodiment, the WSR layer 206 may be a microcrystalline silicon layer having n-type or p-type dopants disposed within the WSR layer 206. In an exemplary embodiment, the WSR layer 206 is an n-type crystalline silicon alloy having n-type dopants disposed within the WSR layer 206. Different dopants disposed within the WSR layer 206 may also influence the WSR layer film optical and electrical properties, such as bandgap, crystalline fraction, conductivity, transparency, film refractive index, extinction coefficient, and the like. In some instances, one or more dopants may be doped into various regions of the WSR layer 206 to efficiently control and adjust the film bandgap, work function (s), conductivity, transparency and so on. In one embodiment, the WSR layer 206 is controlled to have a refractive index between about 1.4 and about 4, a bandgap of at least about 2 eV, and a conductivity greater than about $10^{-6}$ S/cm.

In one embodiment, the WSR layer 206 may comprise an n-type doped silicon alloy layer, such as silicon oxide ($SiO_x$, $SiO_2$), silicon carbide (SiC), silicon oxynitride (SiON), silicon nitride (SiN), silicon carbon nitride (SiCN), silicon oxycarbide (SiOC), silicon oxycarbon nitride (SiOCN), or the like. In an exemplary embodiment, the WSR layer 206 is an n-type SiON or SiC layer.

Furthermore, a p-i buffer type intrinsic amorphous silicon (PIB) layer 208 may be optionally formed between the p-type silicon containing layer 112 and the intrinsic type silicon containing layer 114 in the second p-i-n junction 214. It is believed that the PIB layer 208 may efficiently provide transition film properties between the film layers so as to improve overall conversion efficiency. In one embodiment, the PIB layer 208 may be deposited by providing a gas mixture of hydrogen gas to silane gas in a flow rate ratio by volume of about 50:1 or less, for example, less than about 30:1, for example between about 20:1 and about 30:1, such as about 25:1. Silane gas may be provided at a flow rate between about 0.5 sccm/L and about 5 sccm/L, such as about 2.3 sccm/L. Hydrogen gas may be provided at a flow rate between about 5 sccm/L and 80 sccm/L, such as between about 20 sccm/L and about 65 sccm/L, for example about 57 sccm/L. An RF power between 15 mW/cm² and about 250 mW/cm², such as between about 30 mW/cm² may be provided to the showerhead. The pressure of the chamber may be maintained between about 0.1 Torr and 20 Torr, such as between about 0.5 Torr and about 5 Torr, or about 3 Torr. The deposition rate of the PIB layer 206 may be about 100 Å/min or more.

Furthermore, a degeneratively-doped n-type amorphous silicon layer 210 may be formed primary as the heavily doped n-type amorphous silicon layer to provide improved ohmic contact with the second TCO layer 118. In one embodiment, the heavily doped n-type amorphous silicon layer 210 has a dopant concentration between about $10^{20}$ atoms per cubic centimeter and about $10^{21}$ atoms per cubic centimeter.

Figure 3:
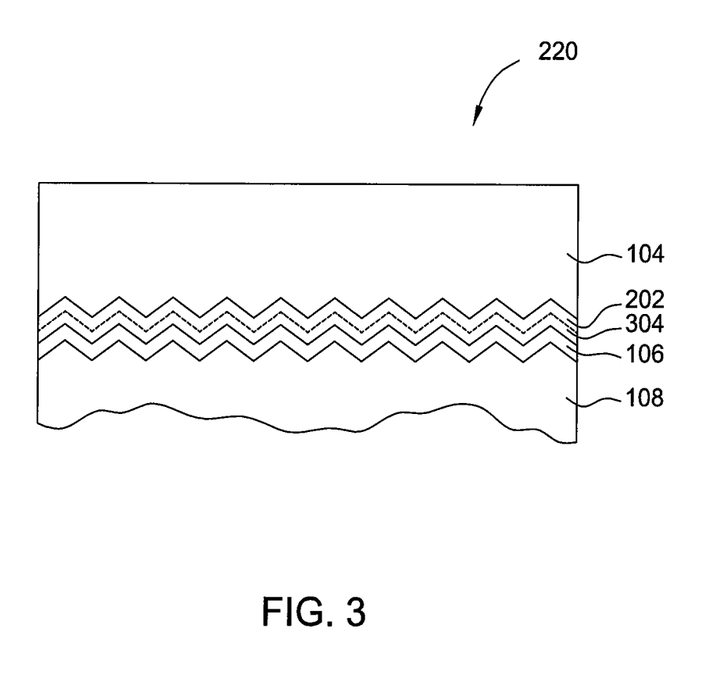
FIG. 3-10 depicts schematic side-view of a tandem junction thin-film solar cell having an interface layer disposed between a TCO layer and a cell junction according to one embodiment of the invention.

FIG. 3 depicts an enlarged view of another embodiment of an interface layer disposed between the TCO layer 104 and the p-type silicon containing layer 106. In addition to the interface layer 202 as described in FIG. 2, a second interface layer 304 may be disposed between the first interface 202 and the p-type silicon containing layer 106. The second interface layer 304 may have a film property different from the first interface layer 202 so as to compensate some electrical properties that the first interface layer 202 does not fully provide. For examples, a film that has higher conductivity often has a relatively lower film transparency, which may adversely absorb or reduce the amount of light passed therethrough to the solar cell junctions, or vice verse. By using this dual layer configuration, a greater amount of light with different wavelengths will be allowed to pass therethrough to the first junction 212 and further to the second junction 214 as well as maintaining a desired film conductivity, so as to generate a greater amount of current.

In one embodiment, the second interface layer 304 is a p-type amorphous silicon layer having a Group III element dopant concentration similar to but different film type (e.g., dopants or alloying elements) from the p-type silicon containing layer 106. For example, when the p-type silicon containing layer 106 is configured to be a p-type amorphous silicon layer, the second interface layer 304 may be configured to be a p-type amorphous silicon carbide layer. The first interface layer 202 may be either a heavily doped p-type amorphous silicon layer or a heavily doped p-type amorphous silicon carbide layer. The second interface layer 304 may be configured to have a p-type dopant concentration smaller than the first interface layer 202 (e.g., the heavily doped p-type layer), but similar to the p-type silicon containing layer 106. In the embodiment depicted in FIG. 3, the first interface layer 202 is a heavily doped amorphous silicon carbide layer having a thickness between about 10 Å and about 200 Å, and the second interface layer is a p-type amorphous silicon carbide layer having a thickness between about 50 Å and about 200 Å. The p-type silicon containing layer 106 is a p-type amorphous silicon layer.

Figure 4:
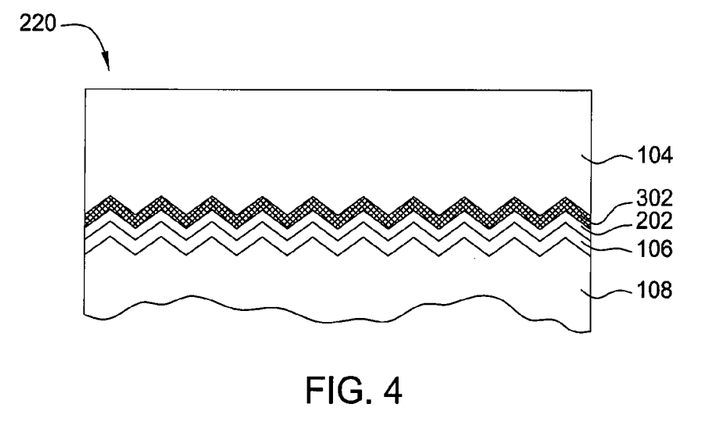

FIG. 4 depicts another embodiment of an interface structure having multiple layers formed between the TCO layer 104 and the p-type silicon containing layer 106. In addition to the interface layer 202 depicted in FIGS. 2-3, an additional TCO layer 302 may be inserted between the bottom TCO layer 104 and the interface layer 202. In one embodiment, as the bottom TCO layer 104 may be configured to be a tin oxide layer ($SnO_2$), the additional TCO layer 302 may be configured to be a zinc oxide layer (ZnO). It is believed that the additional TCO layer 302 provides a better chemical resistance to plasma later performed to form subsequent layers thereon. Good chemical resistance of the additional ZnO TCO layer 302 provides a good surface texture control while performing a plasma or etching process, thereby enhancing light trapping capacity. Furthermore, the additional TCO layer 302 may also provide high film transparency, low film resistivity and high film conductivity so as to maintain high conversion efficiency for the solar junction cells later formed thereon. Accordingly, when forming the additional TCO layer 302 on the bottom TCO layer 104, these film properties may be controlled in a manner that can improve conversion efficiency, reduce contact resistivity, provide high chemical resistance to the plasma and good surface texture desired for trapping light.

In one embodiment, the additional TCO layer 302 may be a zinc oxide layer (ZnO) having a zinc dopant concentration between about 5 percent by weight and about 5 percent by weight. The additional TCO layer 302 may have an aluminum dopant concentration between about 5 percent by weight and about 5 percent by weight. The additional TCO layer 302 may have a thickness controlled between about 50 Å and about 500 Å. The ZnO layer 302 may be formed by a CVD, PVD, or any other suitable deposition techniques.

After forming the additional TCO layer 302 on the bottom TCO layer 104, the interface layer 202 and the p-type silicon containing layer 106 may be consecutively formed thereon to form the desired junctions. In one exemplary embodiment, the interface layer 202 is a heavily doped amorphous silicon layer and the p-type silicon containing layer 106 is a p-type silicon carbide layer.

Figure 5:
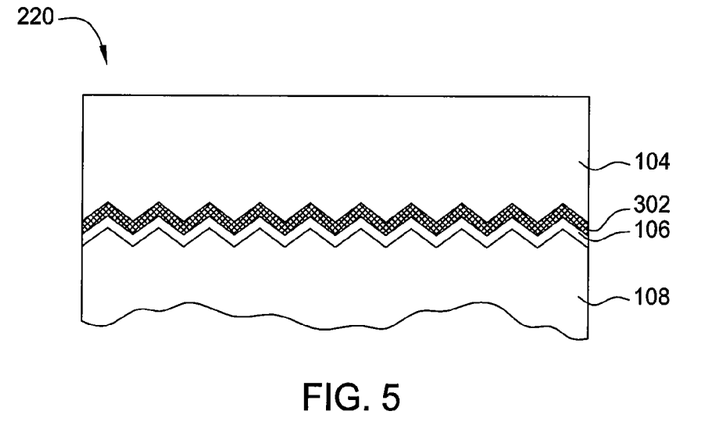

FIG. 5 depicts another embodiment of an interface structure formed between the TCO layer 104 and the p-type silicon containing layer 106. An additional TCO layer 302, similar to the additional TCO layer 302 depicted in FIG. 4, is disposed on the bottom TCO layer 104. Subsequently, the p-type silicon containing layer 106 is disposed on the additional TCO layer 302. In this particular embodiment, the p-type silicon containing layer 106 may be configured to be a p-type microcrystalline/nanocrystalline silicon or silicon carbide layer. It is noted that nanocrystalline silicon layer has grain size about or less than 300 Å and microcrystalline silicon layer has grain size about or greater than about 300 Å. It is believed that a p-type microcrystalline silicon layer or nanocrystalline silicon layer may provide a lower contact resistance, as compared to a p-type amorphous silicon layer. In the exemplary embodiment depicted in FIG. 5, the TCO layer 104 is a tin oxide (SnO2) containing TCO layer. The additional TCO layer 302 is a zinc oxide (ZnO) containing TCO layer and the p-type silicon containing layer 106 is a p-type nanocrystalline silicon carbide layer.

Figure 6:
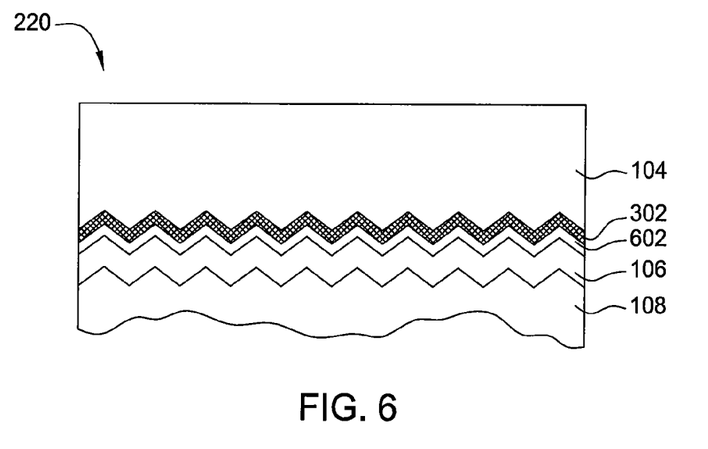

FIG. 6 depicts yet another embodiment of an interface structure formed between the TCO layer 104 and the p-type silicon containing layer 106. An additional TCO layer 302, similar to the additional TCO layer 302 depicted in FIGS. 4-5, is disposed on the bottom TCO layer 104. Subsequently, an intermediate interface layer 602 is disposed on the additional TCO layer 302. It is believed that the intermediate interface layer 602 can assist building high electric field between the additional TCO layer 302 and the to-be-deposited p-type amorphous silicon layer 106, thereby efficiently improving the conversion efficiency of the solar cells. In one embodiment, the intermediate interface layer 602 is a p-type microcrystalline/nanocrystalline silicon layer or p-type microcrystalline/nanocrystalline silicon carbide layer having a thickness between about 10 Å and about 200 Å. Subsequently, the p-type silicon containing layer 106 is disposed on the intermediate interface layer 602. In the exemplary embodiment depicted in FIG. 6, the TCO layer 104 is a tin oxide (SnO2) containing TCO layer. The additional TCO layer 302 is a zinc oxide (ZnO) containing TCO layer. The intermediate interface layer 602 is a p-type microcrystalline/nanocrystalline silicon carbide layer and the p-type silicon containing layer 106 is a p-type amorphous silicon carbide layer.

Figure 7:
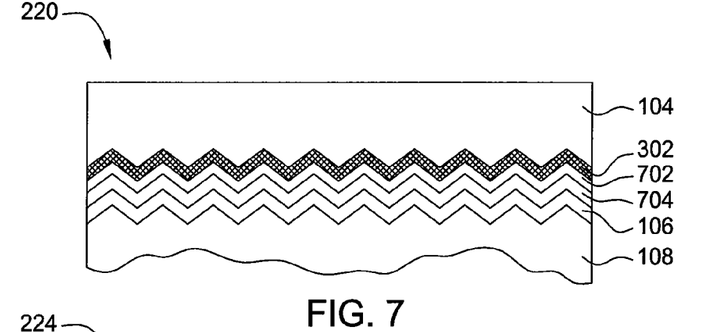

FIG. 7 depicts another embodiment of an interface structure formed between the TCO layer 104 and the p-type silicon containing layer 106. In this embodiment, a triple film structure may be formed between the TCO layer 104 and the p-type silicon containing layer 106. The triple film structure includes an additional TCO layer 302, a first intermediate layer 702 and a second intermediate layer 704. The additional TCO layer 302 is similar to the additional TCO layer 302 depicted in FIGS. 4-6. It is believed that a silicon based layer (e.g., without carbon dopants) may have a relatively higher conductivity while a silicon alloy layer (e.g., with carbon or other alloying dopants) will have high film transparency that can allow high amount of light passing therethrough to the junction cells. Accordingly, by utilizing the triple film structure, high film conductivity, high film transparency for high conversion efficiency, and low contact resistivity may be obtained. In the embodiment depicted in FIG. 7, the first intermediate layer 702 may be a p-type microcrystalline/nanocrystalline silicon layer having a thickness between about 10 Å and about 200 Å. The second intermediate layer 704 may be a p-type microcrystalline/nanocrystalline silicon carbide layer having a thickness between about 40 Å and about 200 Å. After the triple film structure, the p-type silicon containing layer 106 may be formed on the triple film structure. In one embodiment, the p-type silicon containing layer 106 formed on the triple film structure may be a p-type amorphous silicon carbide layer.

Figure 8:
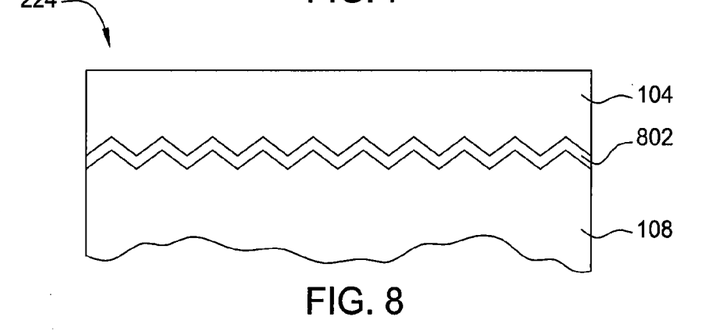

FIG. 8 depicts another embodiment of an interface structure formed between the TCO layer 104 and a p-type silicon containing layer 802. In this particular embodiment, the TCO layer 104 is selected to be fabricated from a zinc oxide (ZnO) containing layer. The p-type silicon containing layer 802 formed thereon is a p-type microcrystalline/nanocrystalline silicon carbide layer having a thickness between about 10 Å and about 200 Å. It is believed that using ZnO based TCO layer 104 may provide good chemical resistance while plasma treatment for depositing the subsequent film layers. Alternatively, the TCO layer 104 may also be configured as a n-type doped aluminum zinc oxide layer (AZO) layer. N-type dopants may include boron, aluminum, gallium, and the like. In this particular embodiment, the ZnO containing TCO layer 104 may have a thickness between about 100 Å and about 10000 Å.

Figure 9:
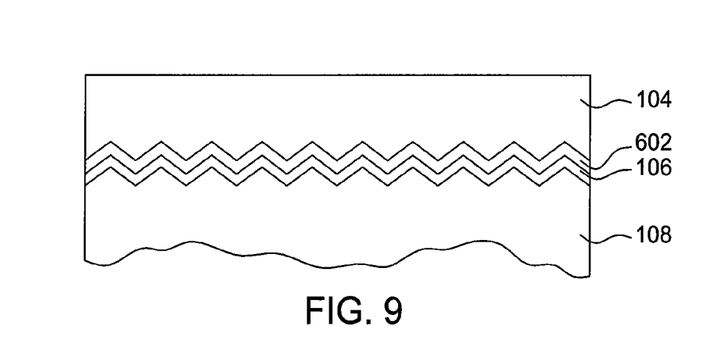

FIG. 9 depicts another embodiment of an interface structure formed between the TCO layer 104 and the p-type silicon containing layer 106. In this particular embodiment, the TCO layer 104 may be selected to be fabricated from a zinc oxide (ZnO) containing layer, similar to the TCO layer 104 described in FIG. 8. An interface layer 602, such as the intermediate interface layer 602 depicted in FIG. 6, is then disposed on the TCO layer 104. It is believed that the interface layer 602 can assist building high electric field between the additional TCO layer 104 and the to-be-deposited p-type amorphous silicon layer 106, thereby efficiently improving the conversion efficiency of the solar cells. In one embodiment, the interface layer 602 is a p-type microcrystalline/nanocrystalline silicon carbide layer having a thickness between about 10 Å and about 200 Å. Subsequently, the p-type silicon containing layer 106 is disposed on the interface layer 602. In the exemplary embodiment depicted in FIG. 9, the TCO layer 104 is a zinc oxide (ZnO) containing TCO layer and the interface layer 602 is a p-type microcrystalline/nanocrystalline silicon carbide layer and the p-type silicon containing layer 106 is a p-type amorphous silicon carbide layer.

Figure 10:
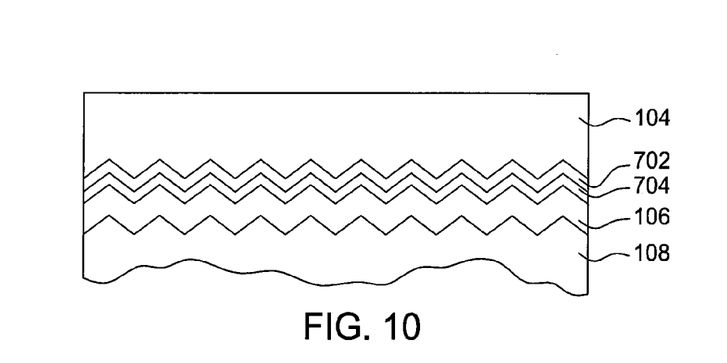

FIG. 10 depicts yet another embodiment of an interface structure formed between the TCO layer 104 and the p-type silicon containing layer 106. In the embodiment depicted in FIG. 10, a double film structure is formed between the TCO layer 104 and the p-type silicon containing layer 106. In this particular embodiment, the TCO layer 104 may be selected to be fabricated from a zinc oxide (ZnO) containing layer, similar to the TCO layer 104 described in FIGS. 7-9. The double film structure includes a first intermediate layer 702 and a second intermediate layer 704, similar to the first intermediate layer 702 and the second intermediate layer 704 depicted in FIG. 7. The first intermediate layer 702 may be a p-type microcrystalline/nanocrystalline silicon layer having a thickness between about 10 Å and about 200 Å. The second intermediate layer 704 may be a p-type microcrystalline/nanocrystalline silicon carbide layer having a thickness between about 40 Å and about 200 Å. After the triple film structure is formed on the TCO layer 104, the p-type silicon containing layer 106 may be formed on the triple film structure. In one embodiment, the p-type silicon containing layer 106 formed on the triple film structure may be a p-type amorphous silicon carbide layer.

Figure 11:
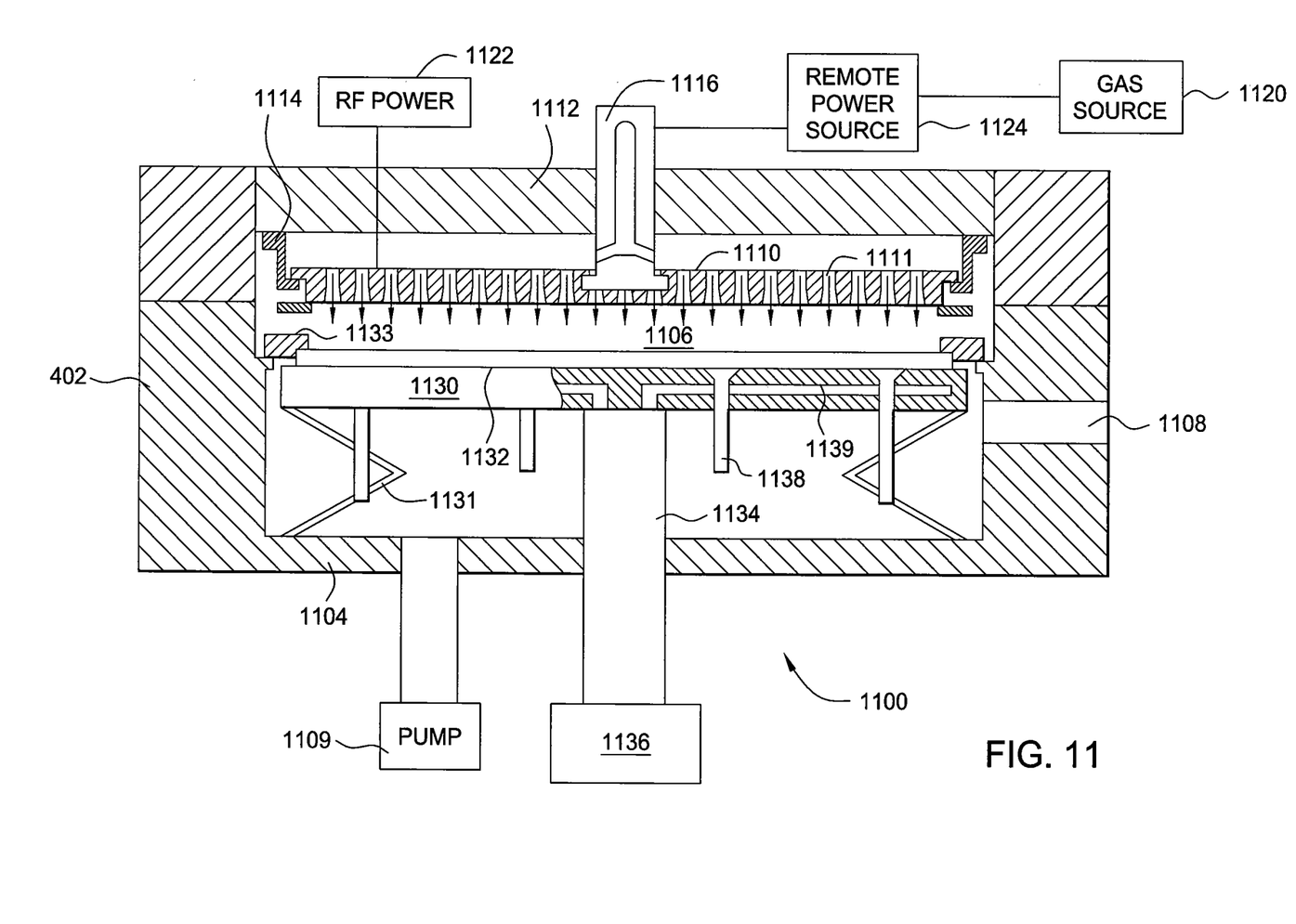
FIG. 11 depicts a cross-sectional view of an apparatus according to one embodiment of the invention.

FIG. 11 is a schematic cross-section view of one embodiment of a plasma enhanced chemical vapor deposition (PECVD) chamber 1100 in which one or more films of a thin-film solar cell, such as the solar cells of FIGS. 1-10 may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 1100 generally includes walls 1102, a bottom 1104, and a showerhead 1110, and substrate support 1130 which define a process volume 1106. The process volume is accessed through a valve 1108 such that the substrate, may be transferred in and out of the chamber 1100. The substrate support 1130 includes a substrate receiving surface 1132 for supporting a substrate and stem 1134 coupled to a lift system 1136 to raise and lower the substrate support 1130. A shadow ring 1133 may be optionally placed over periphery of the substrate 102. Lift pins 1138 are moveably disposed through the substrate support 1130 to move a substrate to and from the substrate receiving surface 1132. The substrate support 1130 may also include heating and/or cooling elements 1139 to maintain the substrate support 1130 at a desired temperature. The substrate support 1130 may also include grounding straps 1131 to provide RF grounding at the periphery of the substrate support 1130.

The showerhead 1110 is coupled to a backing plate 1112 at its periphery by a suspension 1114. The showerhead 1110 may also be coupled to the backing plate by one or more center supports 1116 to help prevent sag and/or control the straightness/curvature of the showerhead 1110. A gas source 1120 is coupled to the backing plate 1112 to provide gas through the backing plate 1112 and through the showerhead 1110 to the substrate receiving surface 1132. A vacuum pump 1109 is coupled to the chamber 1100 to control the process volume 1106 at a desired pressure. An RF power source 1122 is coupled to the backing plate 1112 and/or to the showerhead 1110 to provide a RF power to the showerhead 1110 so that an electric field is created between the showerhead and the substrate support 1130 so that a plasma may be generated from the gases between the showerhead 1110 and the substrate support 1130. Various RF frequencies may be used, such as a frequency between about 0.3 MHz and about 200 MHz. In one embodiment the RF power source is provided at a frequency of 13.56 MHz.

A remote plasma source 1124, such as an inductively coupled remote plasma source, may also be coupled between the gas source and the backing plate. Between processing substrates, a cleaning gas may be provided to the remote plasma source 1124 so that a remote plasma is generated and provided to clean chamber components. The cleaning gas may be further excited by the RF power source 1122 provided to the showerhead. Suitable cleaning gases include but are not limited to $NF_3$, $F_2$, and $SF_6$.

The deposition methods for one or more layers, such as one or more of the layers of FIGS. 1-10 may include the following deposition parameters in the process chamber of FIG. 11 or other suitable chamber. A substrate having a plain surface area of 10,000 $cm^2$ or more, 40,000 $cm^2$ or more, or 55,000 $cm^2$ or more is provided to the chamber. It is understood that after processing the substrate may be cut to form smaller solar cells.

In one embodiment, the heating and/or cooling elements 1139 may be set to provide a substrate support temperature during deposition of about 400° C. or less, for example between about 100° C. and about 400° C. or between about 150° C. and about 300° C., such as about 200° C.

The spacing during deposition between the top surface of a substrate disposed on the substrate receiving surface 1132 and the showerhead 1110 may be between 400 mil and about 1,200 mil, for example between 400 mil and about 800 mil.

Figure 12:
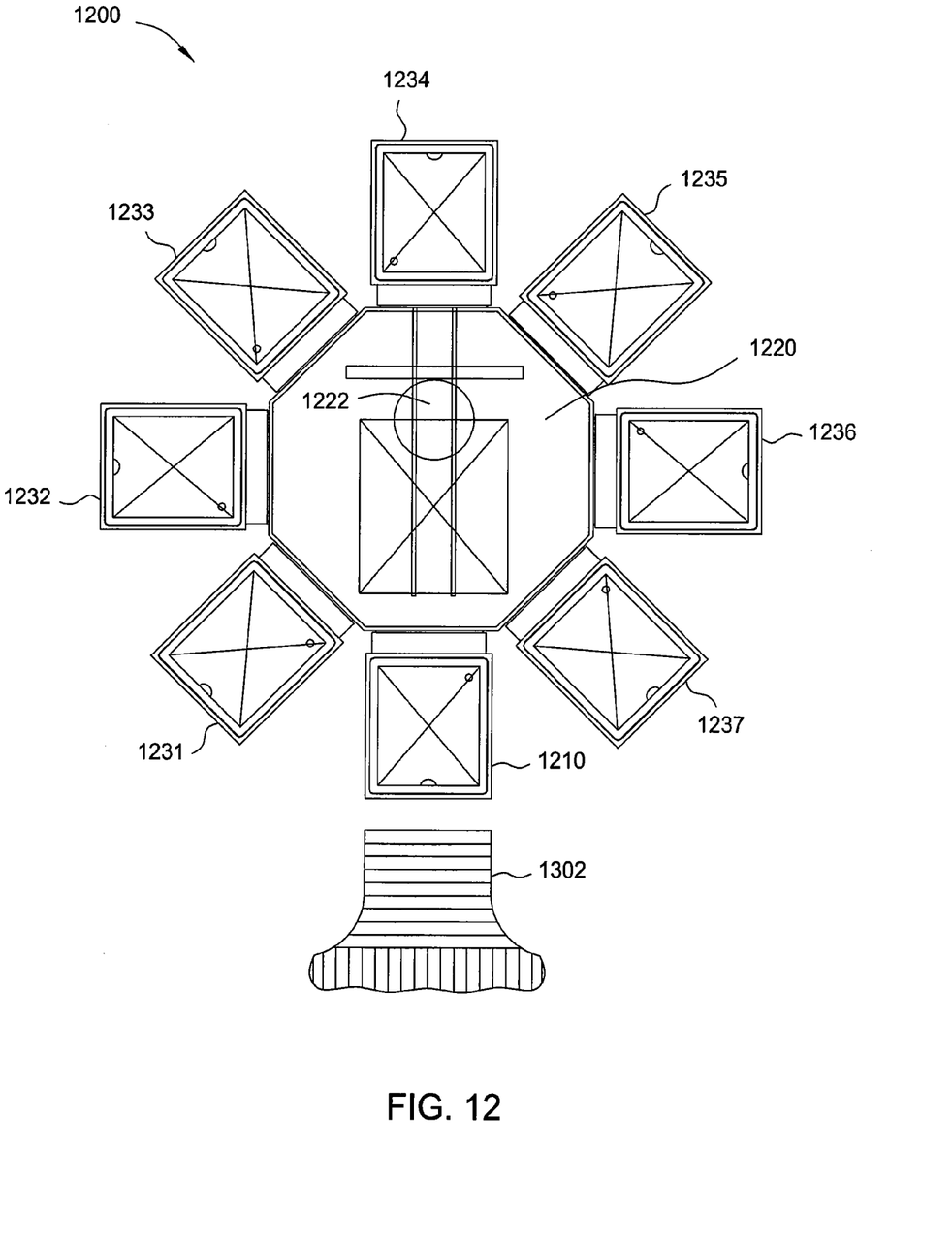
FIG. 12 is a plan view of an apparatus according to another embodiment of the invention.

FIG. 12 is a top schematic view of one embodiment of a process system 1200 having a plurality of process chambers 1231-1237, such as PECVD chamber 1100 of FIG. 11 or other suitable chambers capable of depositing silicon films. The process system 1200 includes a transfer chamber 1220 coupled to a load lock chamber 1210 and the process chambers 1231-1237. The load lock chamber 1210 allows substrates to be transferred between the ambient environment outside the system and vacuum environment within the transfer chamber 1220 and process chambers 1231-1237. The load lock chamber 1210 includes one or more evacuatable regions holding one or more substrate. The evacuatable regions are pumped down during input of substrates into the system 1200 and are vented during output of the substrates from the system 1200. The transfer chamber 1220 has at least one vacuum robot 1222 disposed therein that is adapted to transfer substrates between the load lock chamber 1210 and the process chambers 1231-1237. While seven process chambers are shown in FIG. 12, this configuration is not intended to be limiting as to the scope of the invention, since the system may have any suitable number of process chambers.

In certain embodiments of the invention, the system 1200 is configured to deposit the first p-i-n junction (e.g., reference numeral 122, 212) of a multi-junction solar cell. In one embodiment, one of the process chambers 1231-1237 is configured to deposit the interface layer(s) and p-type layer(s) of the first p-i-n junction while the remaining process chambers 1231-1237 are each configured to deposit both the intrinsic type layer(s) and the n-type layer(s). The intrinsic type layer(s) and the n-type layer(s) of the first p-i-n junction may be deposited in the same chamber without any passivation process in between the deposition steps. Thus, in one configuration, a substrate enters the system through the load lock chamber 1210, the substrate is then transferred by the vacuum robot into the dedicated process chamber configured to deposit the p-type layer(s). Next, after forming the p-type layer the substrate is transferred by the vacuum robot into one of the remaining process chamber configured to deposit both the intrinsic type layer(s) and the n-type layer(s). After forming the intrinsic type layer(s) and the n-type layer(s) the substrate is transferred by the vacuum robot 1222 back to the load lock chamber 1210. In certain embodiments, the time to process a substrate with the process chamber to form the p-type layer(s) is approximately 4 or more times faster, such as 6 or more times faster, than the time to form the intrinsic type layer(s) and the n-type layer(s) in a single chamber. Therefore, in certain embodiments of the system to deposit the first p-i-n junction, the ratio of p-chambers to i/n-chambers is 1:4 or more, such as 1:6 or more. The throughput of the system including the time to provide plasma cleaning of the process chambers may be about 10 substrates/hr or more, such as 20 substrates/hr or more.

In certain embodiments of the invention, a system 1200 is configured to deposit the second p-i-n junction (e.g., reference numerals 124, 214) of a multi-junction solar cell. In one embodiment, one of the process chambers 1231-1237 is configured to deposit the p-type layer(s) of the second p-i-n junction while the remaining process chambers 1231-1237 are each configured to deposit both the intrinsic type layer(s) and the n-type layer(s). The intrinsic type layer(s) and the n-type layer(s) of the second p-i-n junction may be deposited in the same chamber without any passivation process in between the deposition steps. In certain embodiments, the time to process a substrate with the process chamber to form the p-type layer(s) is approximately 4 or more times faster than the time to form the intrinsic type layer(s) and the n-type layer(s) in a single chamber. Therefore, in certain embodiments of the system to deposit the second p-i-n junction, the ratio of p-chambers to i/n-chambers is 1:4 or more, such as 1:6 or more. The throughput of the system including the time to provide plasma cleaning of the process chambers may be about 3 substrates/hr or more, such as 5 substrates/hr or more.

In certain embodiments, the throughput of a system 1200 that is configured for depositing the first p-i-n junction comprising an intrinsic type amorphous silicon layer has a throughput that is two times larger than the throughput of a system 1200 that is used to deposit the second p-i-n junction comprising an intrinsic type microcrystalline silicon layer, due to the difference in thickness between the intrinsic type microcrystalline silicon layer(s) and the intrinsic type amorphous silicon layer(s). Therefore, a single system 1200 that is adapted to deposit the first p-i-n junction, which comprises an intrinsic type amorphous silicon layer, can be matched with two or more systems 1200 that are adapted to deposit a second p-i-n junction, which comprises an intrinsic type microcrystalline silicon layer. Accordingly, the WSR layer deposition process may be configured to be performed in the system adapted to deposit the first p-i-n junction for efficient throughput control. Once a first p-i-n junction has been formed in one system, the substrate may be exposed to the ambient environment (i.e., vacuum break) and transferred to the second system, where the second p-i-n junction is formed. A wet or dry cleaning of the substrate between the first system depositing the first p-i-n junction and the second p-i-n junction may be necessary. In one embodiment, the WSR layer deposition process may be configured to deposit in a separate system.

Figure 13:
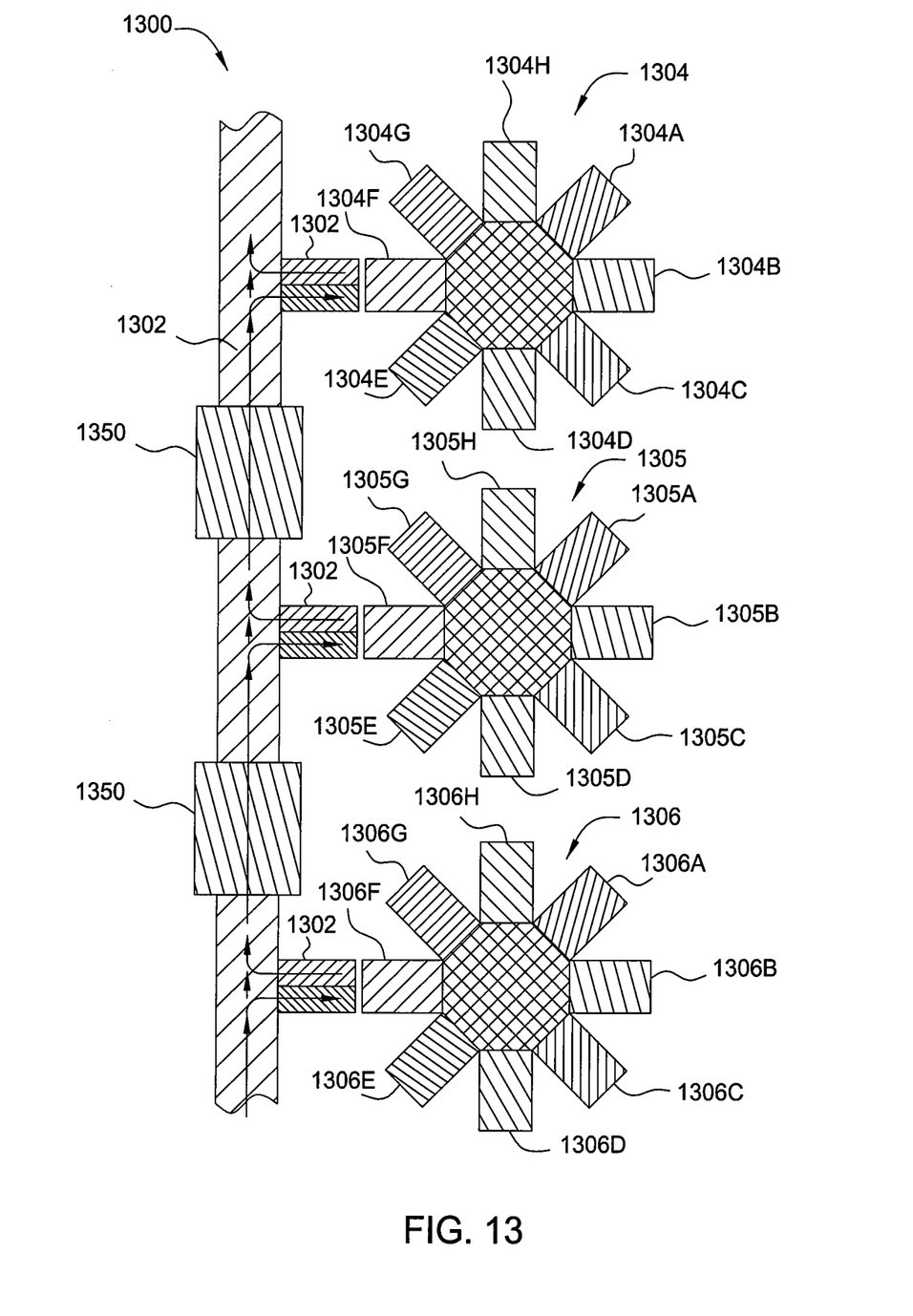
FIG. 13 is a plan view of a portion of a production line having apparatuses of FIGS. 11 and 12 incorporated therein according to one embodiment of the invention.

FIG. 13 illustrates one configuration of a portion of a production line 1300 that has a plurality of deposition systems 1304, 1305, 1306, or cluster tools, that are transferrably connected by automation devices 1302. In one configuration, as shown in FIG. 13, the production line 1300 comprises a plurality of deposition systems 1304, 1305, 1306 that may be utilized to form one or more layers, form p-i-n junction(s), or form a complete solar cell device on a substrate 102. The systems 1304, 1305, 1306 may be similar to the system 1200 depicted in FIG. 12, but are generally configured to deposit different layer(s) or junction(s) on the substrate 102. In general, each of the deposition systems 1304, 1305, 1306 each have a load lock 1304F, 1305F, 1306F, which is similar to the load lock 1210, that are each in transferrable communication with an automation device 1302. The automation device 1302 is configured to move substrates between the deposition systems 1304, 1305 and 1306.

During process sequencing, a substrate is generally transported from a system automation device 1302 to one of the systems 1304, 1305, 1306. In one embodiment, the system 1306 has a plurality of chambers 1306A-1306H that are each configured to deposit or process one or more layers in the formation of an interface layer, a first p-i-n junction, the system 1305 having a plurality of chambers 1305A-1305H is configured to deposit the one or more WSR layer(s), and the system 1304 having the plurality of chambers 1304A-1304H is configure to deposit or process one or more layers in the formation of a second p-i-n junction. It is noted that the number of systems and the number of the chambers configured to deposit each layer in each of the systems may be varied to meet different process requirements and configurations.

The automation device 1302 may generally comprise a robotic device or conveyor that is adapted to move and position a substrate. In one example, the automation device 1302 is a series of conventional substrate conveyors (e.g., roller type conveyor) and/or robotic devices (e.g., 6-axis robot, SCARA robot) that are configured to move and position the substrate within the production line 1300 as desired. In one embodiment, one or more of the automation devices 1302 also contains one or more substrate lifting components, or drawbridge conveyors, that are used to allow substrates upstream of a desired system to be delivered past a substrate that would be blocking its movement to another desired position within the production line 1300. In this way the movement of substrates to the various systems will not be impeded by other substrates waiting to be delivered to another system.

In one embodiment of the production line 1300, a patterning chamber 1350 is in communication with one or more of the conveyors 1302, and is configured to perform a patterning process on one or more of the layers in the formed WSR layer, or any layers utilized to form the junction cells. It is also contemplated that the patterning process can also be used to etch one or more regions in one or more of the previously formed layers during the solar cell devices formation process. While the configurations of the patterning chamber 1350 generally discuss etching type patterning processes, this configuration need not be limiting as to the scope of the invention described herein. In one embodiment, the patterning chamber 1350 is used to remove one or more regions in one or more of the formed layers and/or deposit one or more material layers (e.g., dopant containing materials, metals pastes) on the one or more of the formed layers on the substrate surface.

While the foregoing is directed to embodiments of the present invention, other and further embodiments of the invention may be devised without departing from the basic scope thereof, and the scope thereof is determined by the claims that follow. For example, the process chamber of FIG. 11 has been shown in a horizontal position. It is understood that in other embodiments of the invention the process chamber may be in any non-horizontal position, such as vertical. Embodiments of the invention have been described in reference to the multi-process chamber cluster tool in FIGS. 12 and 13, but in-line systems and hybrid in-line/cluster systems may also be used. Embodiments of the invention have been described in reference to a first system configured to form a first p-i-n junction and a second system configured to form an WSR layer and a third system configured to form a second p-i-n junction, but the first p-i-n junction, WSR layer and a second p-i-n junction may also be formed in a single system. Embodiments of the invention have been described in reference to a process chamber adapted to deposit both an WSR layer, an intrinsic type layer and a n-type layer, but separate chambers may be adapted to deposit the intrinsic type layer and the n-type layer and an WSR layer and a single process chamber may be adapted to deposit both a p-type layer, a WSR layer and an intrinsic type layer. Finally, the embodiments described herein are p-i-n configurations generally applicable to transparent substrates, such as glass, but other embodiments are contemplated in which n-i-p junctions, single or multiply stacked, are constructed on opaque substrates such as stainless steel or polymer in a reverse deposition sequence.

Thus, an apparatus and methods for forming an interface structure between a TCO layer and a solar cell junction. The interface structure advantageously provides low contact resistance, high film conductivity, and high film transparency, which may efficiently improved the photoelectric conversion efficiency and device performance of the PV solar cell as compared to conventional methods.

While the foregoing is directed to embodiments of the present invention, other and further embodiments of the invention may be devised without departing from the basic scope thereof, and the scope thereof is determined by the claims that follow.

What is claimed is:

1. A photovoltaic device, comprising:
    a first TCO layer disposed on a substrate;
    a p-type silicon containing layer formed on the first TCO layer, wherein the p-type silicon containing layer is an amorphous silicon carbide layer having a carbon concentration between about 10 atomic percent and about 20 atomic percent, wherein the p-type silicon containing layer has a first p-type dopant concentration between about $1\times10^{18}$ atoms/cm$^3$ and about $1\times10^{20}$ atoms/cm$^3$; and
    a degeneratively-doped p-type silicon carbide layer disposed between the first TCO layer and the p-type silicon containing layer, wherein the degeneratively-doped p-type silicon layer has a second p-type dopant concentration higher than the first p-type dopant concentration of the p-type silicon containing layer, wherein the second p-type dopant concentration is between $1\times10^{20}$ atoms/cm$^3$ and about $1\times10^{21}$ atoms/cm$^3$, a p-type nanocrystalline silicon layer disposed between the first TCO layer and the degeneratively-doped p-type silicon carbide layer, an intrinsic type silicon containing layer disposed on the p-type silicon containing layer, and a n-type silicon containing layer disposed on the intrinsic type silicon containing layer.

2. The photovoltaic device of claim 1, wherein the degeneratively-doped p-type silicon carbide layer is at least one of a microcrystalline silicon carbide layer, a nanocrystalline silicon carbide layer, or an amorphous silicon carbide layer.

3. The photovoltaic device of claim 1, further comprising a second TCO layer disposed between the first TCO layer and the p-type silicon containing layer.

4. The photovoltaic device of claim 3, wherein the first TCO layer is a tin oxide containing layer and the second TCO layer is a zinc oxide containing layer.

5. The photovoltaic device of claim 1, wherein the intrinsic type silicon containing layer is an intrinsic type amorphous silicon layer and the n-type silicon containing layer is a crystalline silicon layer.

6. The photovoltaic device of claim 3, wherein the second TCO layer has a thickness between about 50 Å and about 500 Å.

7. A photovoltaic device, comprising:
    a TCO layer disposed on a substrate;
    an interface layer disposed on the TCO layer, and
    a p-type silicon containing layer disposed on and in physical contact with the interface layer, wherein the p-type silicon containing layer is an amorphous silicon carbide layer having a carbon concentration between about 10 atomic percent and about 20 atomic percent, wherein the p-type silicon containing layer has a first p-type dopant concentration between about $1\times10^{18}$ atoms/cm$^3$ and about $1\times10^{20}$ atoms/cm$^3$, wherein the interface layer is a degeneratively doped p-type silicon carbide layer having a second p-type dopant concentration higher than the first p-type dopant concentration of the p-type silicon containing layer, wherein the second p-type dopant concentration is between $1\times10^{20}$ atoms/cm$^3$ and about $1\times10^{21}$ atoms/cm$^3$, a p-type nanocrystalline silicon layer disposed between the interface layer and the TCO layer, an intrinsic type silicon layer disposed on the p-type silicon containing layer, and a n-type silicon layer disposed on the intrinsic type silicon containing layer.

8. The photovoltaic device of claim 7, wherein the intrinsic type silicon layer is amorphous, and the n-type silicon layer is crystalline.

9. The photovoltaic device of claim 7, wherein the interface layer is a p-type microcrystalline silicon carbide layer.

10. The photovoltaic device of claim 7, wherein the TCO layer is a zinc oxide containing layer having n-type doping element selected from aluminum, boron or gallium.

11. A method of forming a photovoltaic device, comprising:
   forming a first TCO layer on a substrate;
   forming a second TCO layer disposed on and in physical contact with the first TCO layer; and
   forming a first p-i-n junction on the second TCO layer; and
   forming a degeneratively doped p-type silicon carbide layer between the second TCO layer and the first p-i-n junction, wherein the first p-i-n junction comprises:
      forming a p-type silicon containing layer over the second TCO layer, wherein the p-type silicon containing layer is a microcrystalline silicon based layer, a nanocrystalline silicon based layer or an amorphous silicon based layer, wherein the p-type silicon containing layer is a first silicon carbide layer having a carbon concentration between about 10 atomic percent and about 20 atomic percent, wherein the p-type silicon containing layer has a p-type dopant concentration between about $1\times10^{18}$ atoms/cm$^3$ and about $1\times10^{20}$ atoms/cm$^3$;
      forming an intrinsic type silicon containing layer over the p-type containing layer; and
      forming a n-type silicon containing layer over the intrinsic type silicon containing layer, wherein the degeneratively doped p-type silicon layer has a second p-type dopant concentration higher than the first p-type dopant concentration of the p-type silicon containing layer, wherein the second p-type dopant concentration is between $1\times10^{20}$ atoms/cm$^3$ and about $1\times10^{21}$ atoms/cm$^3$, and a p-type nanocrystalline silicon layer disposed between the second TCO layer and the degeneratively-doped p-type silicon carbide layer.

12. The method of claim 11, wherein the degeneratively-doped p-type silicon layer disposed between the second TCO layer and the first p-i-n junction is at least one of a microcrystalline silicon carbide layer, a nanocrystalline silicon carbide layer, or an amorphous silicon carbide layer.

13. The method of claim 12, wherein the degeneratively-doped p-type silicon carbide layer is a p-type nanocrystalline silicon carbide layer.

14. The method of claim 11, wherein the p-type silicon containing layer is an amorphous silicon carbide layer, and the intrinsic type silicon containing layer is an intrinsic type amorphous silicon layer and the n-type silicon containing layer is a crystalline silicon layer.

15. The method of claim 11, wherein the first TCO layer is a tin oxide containing layer and the second TCO layer is a zinc oxide containing layer.

* * * * *

UNITED STATES PATENT AND TRADEMARK OFFICE
CERTIFICATE OF CORRECTION

PATENT NO. : 8,895,842 B2  
APPLICATION NO. : 12/481175  
DATED : November 25, 2014  
INVENTOR(S) : Sheng et al.

Page 1 of 1

It is certified that error appears in the above-identified patent and that said Letters Patent is hereby corrected as shown below:

In the Specification,

In Cross-Reference to Related Applications:

Column 1, Line 11, please delete "Aug. 30, 2008" and insert --Aug. 29, 2008-- therefor.

Signed and Sealed this  
Fifth Day of May, 2015

Michelle K. Lee  
*Director of the United States Patent and Trademark Office*